(12) United States Patent
Li et al.

(10) Patent No.: US 7,286,953 B1
(45) Date of Patent: Oct. 23, 2007

(54) DEVICE TESTING AUTOMATION UTILITY AND METHOD

(75) Inventors: Rui Li, Irvine, CA (US); Chirjeev Singh, Tustin, CA (US); Ohannes Kuftedjian, Irvine, CA (US); Xilin Zhu, Gloucestershire (GB)

(73) Assignee: Mindspeed Technologies, Inc., Newport Beach, CA (US)

( * ) Notice: Subject to any disclaimer, the term of this patent is extended or adjusted under 35 U.S.C. 154(b) by 55 days.

(21) Appl. No.: 11/358,541

(22) Filed: Feb. 21, 2006

(51) Int. Cl.
*G06F 19/00* (2006.01)

(52) U.S. Cl. ............... 702/123; 702/108; 702/117; 702/119; 702/121; 717/100; 717/110

(58) Field of Classification Search ........... 702/108, 702/117, 118, 119, 121, 122, 123; 709/230; 715/762, 763, 764, 810, 826; 717/100, 110
See application file for complete search history.

(56) References Cited

U.S. PATENT DOCUMENTS

| | | | | | |
|---|---|---|---|---|---|
| 2,950,437 | A | * | 8/1960 | Stahl | 324/73.1 |
| 3,082,374 | A | * | 3/1963 | Buuck | 324/73.1 |
| 3,237,100 | A | * | 2/1966 | Chalfin et al. | 324/108 |
| 3,246,240 | A | * | 4/1966 | Arnold et al. | 324/500 |
| 4,412,218 | A | * | 10/1983 | Niitsu | 340/825.56 |
| 5,081,297 | A | * | 1/1992 | Lebel et al. | 710/104 |
| 6,957,420 | B2 | * | 10/2005 | Hand et al. | 717/125 |

\* cited by examiner

*Primary Examiner*—Edward R Cosimano (57) ABSTRACT

Various apparatuses, methods, computer programs, and other systems are disclosed for facilitating testing of a module. In embodiment, a method is provided that comprises the steps of creating a plurality of tasks in a computer system, each of the tasks comprising a list of commands that are sent to a plurality of test devices, the test devices comprising the module to be tested and at least one controlled device interfacing with the module during a test of an operation of the module. In addition, the tasks are organized according to a multi-level hierarchy. The tasks are executed according to an order inherent in the multi-level hierarchy, wherein the execution of each task entails communicating the commands of each task to a respective one of the test devices.

29 Claims, 7 Drawing Sheets

DEVICE TESTING AUTOMATION UTILITY AND METHOD

BACKGROUND

In the communications industry and in other industries, integrated circuits are created that are quite complex and include extensive circuitry to perform various functions. Such chips may include multiple processors and other logic that comprises literally millions of circuit components. In the communications field, such integrated circuits or chips may form the backbone of a given device such as a codec, modem, or other device. It is often desirable when contemplating the purchase of such chips for use in end devices such as modems, network telephones, and other devices that customers will want to test the operation of such chips. Given the complexity of these devices, it is often the case that extensive configuration software is generated and shipped along with a chip to be provided to customers so that customers may control the operation of a chip during testing to make sure the chip operates to their satisfaction. Customers may then perform tests of the chip in question using their own equipment. Due to the complexity of the chips to be tested, it is often the case that customers will write their own testing software to calibrate the test equipment, configure the chip to be tested, and to actually run tests on the chip and log results. This testing process can take a lot of time and significantly delays the successful sale of new chips.

BRIEF DESCRIPTION OF THE SEVERAL VIEWS OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION

Figure 1:
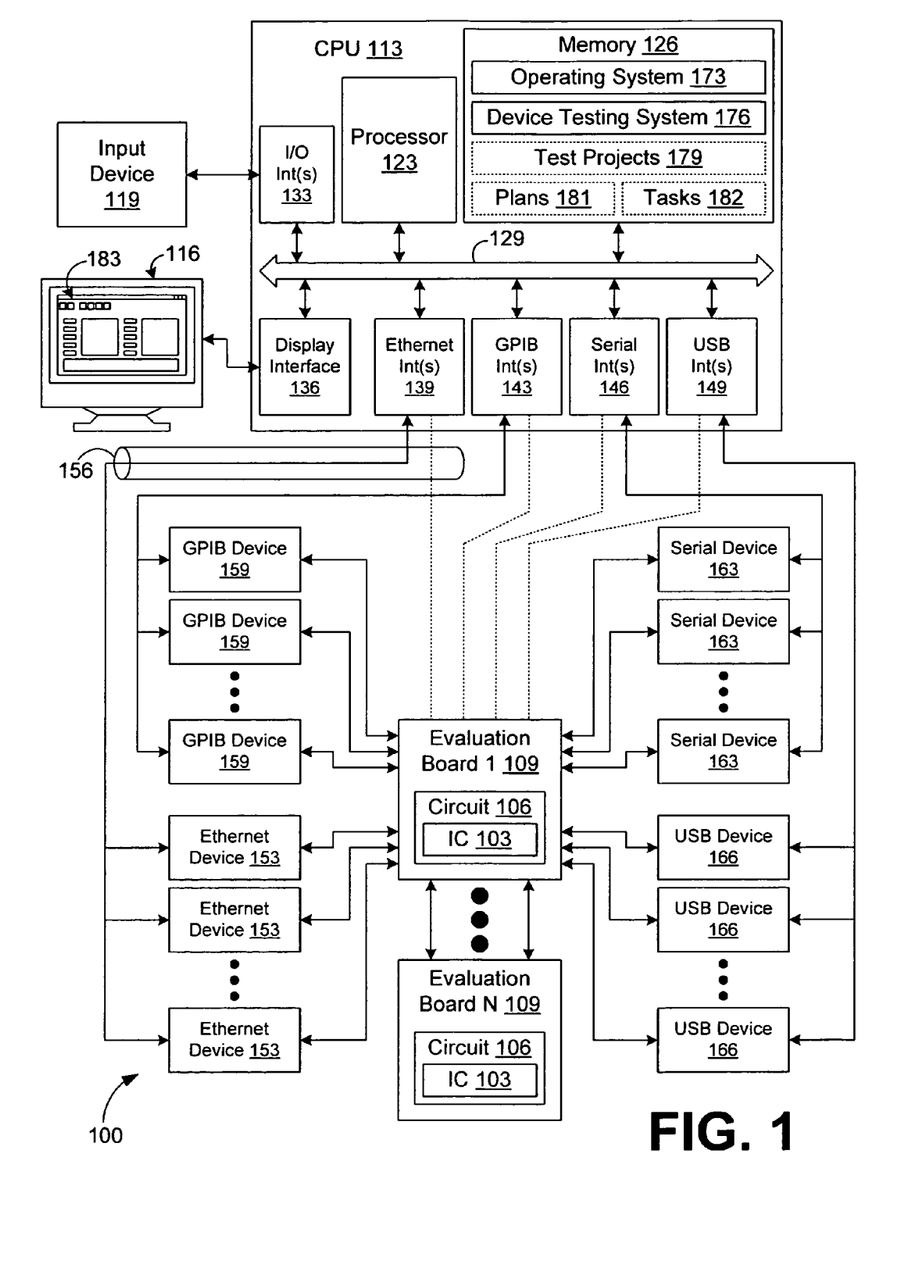
FIG. 1 is a block diagram of a testing environment that includes a device testing system that is employed to test an evaluation module that includes an integrated circuit according to an embodiment of the present invention.

With reference to FIG. 1, shown is a testing environment 100 according to an embodiment of the present invention. The testing environment 100 facilitates a testing of one or more integrated circuits 103 that typically make-up a part of a circuit 106 disposed on a respective evaluation board 109. Alternatively, the integrated circuits 103 may be disposed on some electrical structure other than an evaluation board 109. In this respect, the testing environment 100 includes, for example, a computer system comprising a central processing unit (CPU) 113, a display device 116, and various input devices 119 such as, for example, a keyboard, mouse, microphone, or other input device as can be appreciated. The computer system may comprise, for example, a desktop, laptop, palm, workstation, or other computer system. In the following discussion, first the general structure of the testing environment 100 will be discussed, generally followed by discussion of the operation of the same.

The integrated circuit 103 or "chip" may perform any one of a number of functions. In one embodiment, the integrated circuit 103 performs various communications functions such as facilitating communications in a voice-over-IP interface or a digital subscriber loop. The integrated circuit 103 may also comprises other devices, for example, such as a laser driver with digital diagnostic monitoring interface devices, cross-point switch devices, clock data recovery devices, video cable driver devices, video signal equalizer devices, and other devices.

The CPU 113 includes various components such as, a processor 123 and a memory 126, both of which are coupled to a local interface 129. In this respect, the local interface 129 may comprise, for example, a data bus with an accompanying control/address bus as can be appreciated by those with ordinary skill in the art. The CPU 113 also includes various interfaces to facilitate coupling the local interface 129 with external devices. Such interfaces include, for example, a I/O interface 133 that facilitates coupling the input devices 119 to the local interface 129 and makes input data generated by the input devices 119 available to the processor 123 on the local interface 129. Similarly, the display device 116 is coupled to the local interface 129 by way of a display interface 136. In this respect, the display interface 136 may comprise, for example, a video card or other device that is configured to drive a given type of display device 116 as can be appreciated.

In addition, the CPU 113 includes various interfaces for coupling various networks and external devices to the local interface 129 to facilitate communication between the CPU 113 and such external devices. Such interfaces may comprise, for example, network interfaces 139, such as Ethernet interfaces or other types of network interfaces. In this respect, the network interfaces 139 may comprise, for example, an appropriate network card that may or may not be integrated with a motherboard of the CPU 113.

The CPU 113 may also include a general-purpose interface bus (GPIB) interface 143 that may be employed to communicate with external devices via a general-purpose interface bus. In one embodiment, a GPIB interface is employed for the exchange of information between the CPU 113 and industrial automation equipment as will be described. In addition, the CPU 113 may include serial interfaces 146 and universal serial bus interfaces 149. In this respect, all of the interfaces 139, 143, 146, and 149 may comprise various interface cards linked to the local interface 129 through various slots, or such interfaces may actually be integrated with a motherboard of the CPU 113 or other structure such as typically might be the case where the CPU 113 is embodied in a laptop computer, etc.

The testing environment 100 also includes various devices that are coupled to both the CPU 113 through the various interfaces 139, 143, 146, or 149, and are coupled to one or more evaluation boards 109. These devices may comprise, for example, network devices 153 such as, for example, Ethernet devices that communicate with the CPU 113 through the network interface 139 through a network connection 156 such as an Ethernet network or other type of network. The devices also may include GPIB devices 159 that communicate with the CPU 113 through the GPIB interface bus 143. In this respect, the protocol that is needed for the GPIB devices 159 by which they communicate with the CPU 113 is the general purpose interface bus protocol as can be appreciated. The testing environment 100 may also include various serial devices 163 or universal serial bus devices 166 that communicate with the CPU 113 through the serial interface 146 or the universal serial bus interface 149 as can be appreciated.

The network devices 153, GPIB devices 159, serial devices 163, and universal serial bus devices 166 may comprise various industrial automation equipment such as, for example, power supplies, spectrum analyzers, current meters, voltage meters, and other devices. Some representative devices include the Agilent N4901B Serial BERT, Agilent Infiniium DCA 86100A Oscilloscope, Agilent 8613B Lightwave Multimeter, HP E3631A Power Supply, MVA 3000 Multiformat Video Analyzer from SyntheSys Research, Inc., and other devices. Given that the CPU 113 communicates with the evaluation board 109 and the devices 153, 159, 163, and 166 to configure such devices, calibrate such devices, and/or run a test to obtain test data or for some other reason, the evaluation board 109 (the device(s) to be tested) and/or the devices 153, 159, 163, and 166 are all generically referred to herein as a "test device" to facilitate the discussion below.

Thus, the CPU 113 communicates with the various devices 100 using multiple different protocols such as, Ethernet, General Purpose Interface Bus (GPIB) protocol, serial data communication protocols, or universal serial bus protocols in communicating with the various devices. While specific examples of protocols are outlined herein, it is understood that other protocols may be employed that are not mentioned herein that facilitate communication between the CPU 113 and various devices that make up the testing environment 100. In addition, the CPU 113 may communicate directly with the evaluation boards 109 through any one of the interfaces 139, 143, 146, or 149 and may use the protocols associated therewith. Alternatively, the CPU 113 may communicate with the evaluation boards 109 using some other protocol not listed herein. In addition, where multiple evaluation boards 109 are evaluated in a given testing environment 100, the multiple evaluation boards 109 may be interlinked with each other and receive data from each other rather than linking multiple instances of testing devices to each evaluation board 109 as shown.

The CPU 113 also includes a number of components that are stored on the memory 126 and are executable by the processor 123. These components may comprise, for example, an operating system 173 and a device testing system 176. The device testing system 176 is executed by the processor 123 as initiated by various inputs received through the input devices 119 to create test projects 179, plans 181, and tasks 182 that are stored in the memory 126. The tasks 182 of the test projects 179 are executed or run in order to orchestrate the configuration, calibration, and operation of the test devices to facilitate a testing of the evaluation board 109. The tasks 182, plans 181, and test projects 179 are organized in a multi-level hierarchy to facilitate reduce the time it takes to test a given integrated circuit 103 as will be described.

To facilitate the creation of the test projects 179, various graphical user interfaces 183 are generated by the device testing system 176 on the display device 116 through the display interface 136. In this respect, the graphical user interfaces 183 facilitate the input of data, commands, and other input information into the CPU 113 during manipulation of the device testing system 176 in creating and executing test projects 179 as will be described.

In one embodiment, a number of software components are stored in the memory 126 and are executable by the processor 123. In this respect, the term "executable" means a program file that is in a form that can ultimately be run by the processor 123. Examples of executable programs may be, for example, a compiled program that can be translated into machine code in a format that can be loaded into a random access portion of the memory 126 and run by the processor 123, or source code that may be expressed in proper format such as object code that is capable of being loaded into a of random access portion of the memory 126 and executed by the processor 123, etc. An executable program may be stored in any portion or component of the memory 126 including, for example, random access memory, read-only memory, a hard drive, compact disk (CD), floppy disk, or other memory components.

The memory 126 is defined herein as both volatile and nonvolatile memory and data storage components. Volatile components are those that do not retain data values upon loss of power. Nonvolatile components are those that retain data upon a loss of power. Thus, the memory 126 may comprise, for example, random access memory (RAM), read-only memory (ROM), hard disk drives, floppy disks accessed via an associated floppy disk drive, compact discs accessed via a compact disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

In addition, the processor 123 may represent multiple processors and the memory 26 may represent multiple memories that operate in parallel. In such a case, the local interface 129 may be an appropriate network that facilitates communication between any two of the multiple processors, between any processor and any one of the memories, or between any two of the memories etc. The processor 123 may be of electrical or optical construction, or of some other construction as can be appreciated by those with ordinary skill in the art.

The operating system 173 is executed to control the allocation and usage of hardware resources such as the memory, processing time and peripheral devices in the computer system. In this manner, the operating system 173 serves as the foundation on which applications depend as is generally known by those with ordinary skill in the art.

In order to test the integrated circuits 103 of a given circuit 106 on the evaluation board 109, a user may manipulate the device testing system 176 to create a test project 179. The test project 179 may be stored in the non-volatile portion of the memory 126 and may be run or executed to facilitate the configuration, calibration, and testing of the integrated circuits 103 of the evaluation boards 109. When executed, the device testing system 176 communicates with the test devices such as devices 153, 159, 163, and 166 through the interfaces 139, 143, 146, and 149 based upon the specific tasks created as part of a given test project 179. As will be described, the device testing system 176 facilitates the creation and organization of tasks for a given test project 179 that are organized according to a multi-level hierarchy. Such a multi-level hierarchy dictates the order at which various tasks are executed. Also, the device testing system 176 allows users to create the tasks themselves that are organized into the multi-level hierarchy.

The tasks created may comprise, for example, a list of various commands that are transmitted to the test devices as is desired. The commands may facilitate the configuration or calibration of the test devices such as the integrated circuits 103 on one or more of the evaluation boards 109 in order to perform a given test. Also, the commands may control the operation of test devices during a given test. In some tests, data may be generated that is stored in logs in a portion of the memory 126, etc.

Thus, the device testing system 176 facilitates the creation of test projects 179 that includes tasks for configuring the test devices, calibrating the test devices, and for controlling the test devices during the performance of a test operation. Given that a number of different interfaces 139, 143, 146, and 149 are employed to communicate with the various devices 153, 159, 163, and 166 according to the protocols native to such devices 153, 159, 163, and 166, a plurality of communication protocols are thus employed to communicate the commands of the various tasks to the respective ones of the test devices 153, 159, 163, and 166. Also, the device testing system 176 may be programmed to communicate with a given one of the test devices using a protocol unique to the given one of the test devices (such as an evaluation board 109).

In one embodiment, all of the commands of a given one of the tasks are communicated to a respective one of the test devices according to one of the protocols through a respective one of the interfaces 139, 143, 146, and 149. In one embodiment, a given protocol is native to a respective one or more of the test devices. Therefore, in one embodiment, the CPU 113 does not communicate to any one of the test devices using more than a single communications protocol through a single one of the interfaces 139, 143, 146, and 149. Thus, the device testing system 176 provides an advantage in that a user can test a given integrated circuit 103 without having to write tedious protocol related program segments. Rather, the higher level commands are entered by a user, thereby reducing the amount of time it takes to test a new integrated circuit 103.

Figure 2:
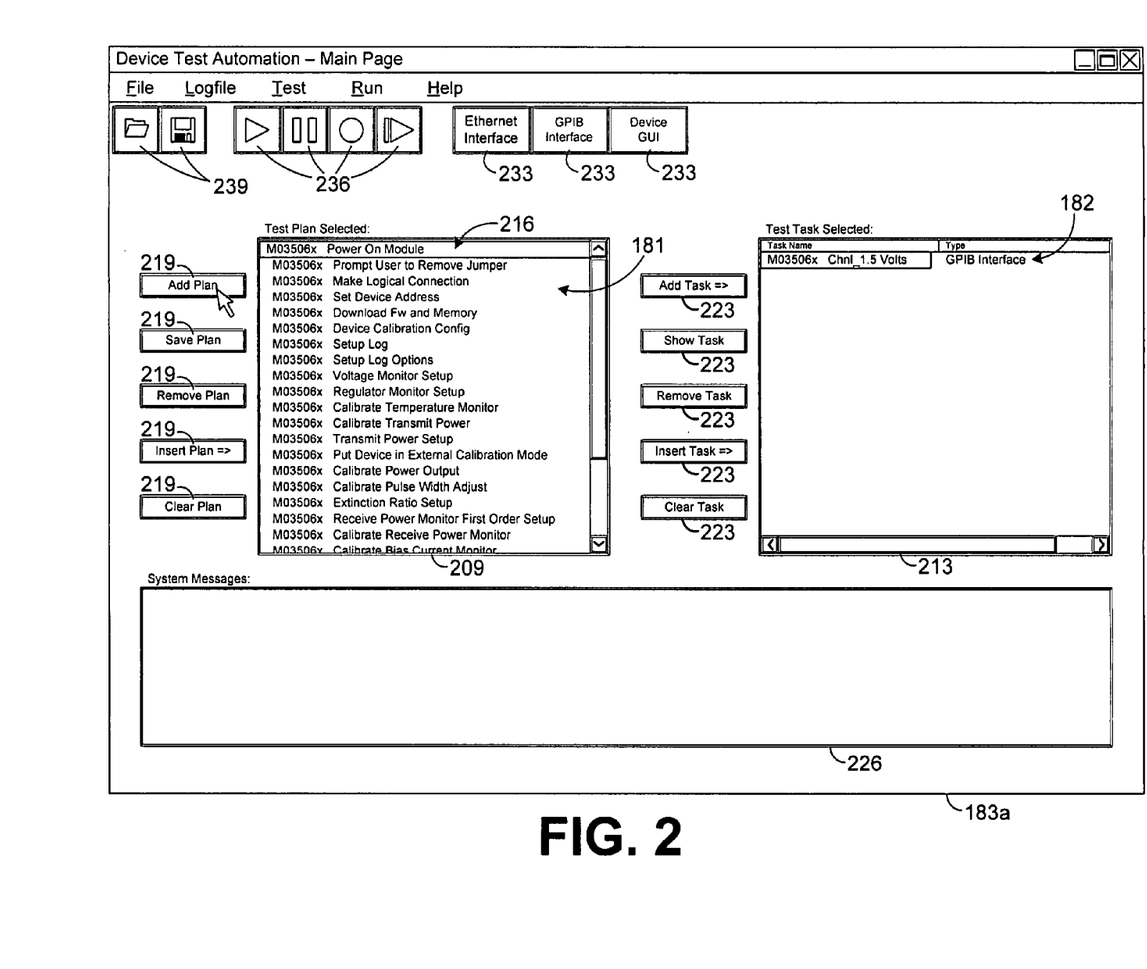
FIG. 2 is a drawing of a graphical user interface generated by the device testing system of FIG. 1 according to an embodiment of the present invention.

Referring then to FIG. 2, shown is one example of a graphical user interface 183 (FIG. 1) noted herein as graphical user interface 183*a* according to an embodiment of the present invention. The graphical user interface 183*a* serves, for example, as a main page of the device testing system 176. The graphical user interface 183*a* facilitates the creation of a test project 179 that is saved as a file on a non-volatile portion of the memory 126 as described above. The test project 179 includes a number of "plans" 181 as introduced above. Each plan 181 may include one or more tasks 182. These relationships embody the multi-level hierarchy mentioned above. While three distinct levels (i.e. project 179, plans 181, and tasks 182) are described herein, it is understood that a greater or lesser number of levels may be employed in a given multi-level hierarchy as described herein. In this respect, the graphical user interface 183*a* includes a plan window 209 that lists a number of plans 181 and a task window 213 that lists each of the tasks 182 associated with a given one of the plans 181. In this respect, the tasks 182 that are displayed in the task window 213 are associated with a selected one of the plans 181. A plan 181 is indicated as being "selected" by highlighting 216 that is applied to the plan 181. This is typically done, for example, by "clicking" on the plan 181 by positioning a cursor over the plan and pressing a button of a mouse associated with a computer system as can be appreciated.

Thus, the graphical user interface 183*a* illustrates the multi-level hierarchy by which tasks 182 are organized. Specifically, a project 179 is the subject of a file accessed by the device testing system 173. Associated with each project 179 are a number of plans 181. A selection of one of the plans 181 as indicated by the highlighting 216 causes each of the tasks 182 associated with such plan 181 to be displayed in the task window 213. Thus, the tasks 182 are organized in the multi-level hierarchy by associating the plans 181 with a given test project 179, and by associating respective ones of the tasks 182 with specific ones of the plans 181. The graphical user interface 183 advantageously depicts the associations between the tasks 182 and respective one of the plans 181 using the plan and task windows 209 and 213. In one embodiment, the plans 181 are saved in the memory 126 in a pool of plans 181. The test project 179 saved in the memory 126 indicates the plans 181 associated therewith. Similarly, in one embodiment, the tasks 182 are saved in the memory 126 in a pool of tasks 182. Each plan 181 saved in the memory 126 indicates the tasks 182 associated therewith. Saving plans 181 and tasks 182 in this manner advantageously facilitates their use in multiple ones of the projects 179 without having to recreate individual plans 182 and tasks 181. That is to say, once a given plan 181 or task 182 is created and saved in the memory 126, it may be selected for use in a plurality of projects 179 that may require the same plan 181 or task 182. This facilitates reuse of tasks 182 and plans 181 for the testing of different integrated circuits 103 an significantly reduces the time it takes to set up new tests, rather than having to write unique software for the testing of each new integrated circuit 103.

In view of the above discussion, the graphical user interface 183*a* includes various graphical components 219 that may be manipulated by a user to create, edit, save, insert, clear, and remove various ones of the plans 181. Similarly, the graphical user interface 183*a* also includes graphical components 223 that may be manipulated by a user to facilitate adding, saving, removing, inserting, or clearing various ones of the tasks 182 displayed in the task window 213. Also, graphical user components such as up and down arrow buttons may be employed to rearrange the order of the plans 181 and tasks 182 listed in the plan window 209 and the task window 213. Specifically, such arrows may be employed to move highlighted ones of the plans 181 or tasks 182 up or down in the listing of the plan window 209 or the task window 213, etc. It may be the case that other graphical user interfaces are generated on the display device 116 based upon manipulation of the graphical components 219 and 223 to facilitate the adding, saving, removing, inserting, or other action relative to the plans 181 and the tasks 182. In addition, various messages may be recorded and displayed in the message window 226 as shown.

In addition, the graphical user interface 183*a* includes task interface components 233 that may be manipulated to generate a second graphical user interface that facilitates the entry and editing of specific tasks. The task interface components 233 comprise, for example, push buttons or other types of graphical user interface components that trigger the creation of the next graphical user interface as can be appreciated. In one embodiment, the task interface components 233 are each associated with a specific one of a number of different types of protocols that may be employed for data communication between the CPU 113 (FIG. 1) and the test devices.

In addition, the graphical user interface 183*a* includes execution components 236 that may be manipulated to cause the various tasks 182 associated with the listed plans of a given project 179 to be executed, paused, stopped, or continued, etc. While the execution components 236 are depicted as push buttons, it is understood that other types of graphical user components may be employed to accomplish the same purpose of the execution components 236 shown. In addition, the graphical user interface 183*a* includes "open" and "save" components 239 that allow an individual to open or save a given project 179 (FIG. 1) stored in a non-volatile portion of the memory 126 (FIG. 1). In this respect, the organization or associations of the plans 181 and the tasks 182 with a given project 179 are saved as the project 179. In addition, other graphical components may be employed in the user interface 183 to provide for other types of functionality as can be appreciated.

Figure 3:
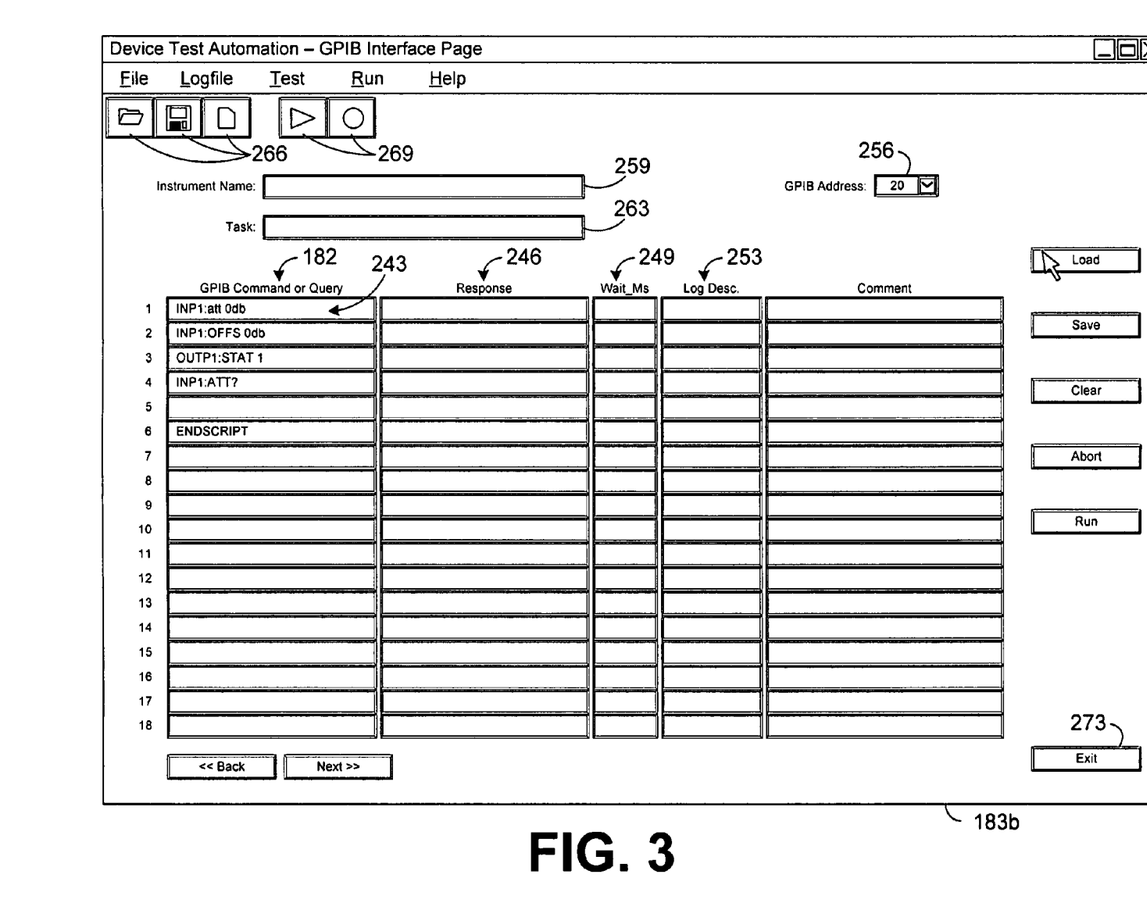
FIG. 3 is a drawing of another graphical user interface generated by the device testing system of FIG. 1 according to an embodiment of the present invention.

Referring next to FIG. 3, shown is a second graphical user interface 183*b* that is generated upon a manipulation of one of the task interface components 233 (FIG. 2) or upon a manipulation of the show task button 223 (FIG. 2), or upon the an occurrence of some other action or condition, etc. The graphical user interface 183*b* provides one example of a user interface that may be employed to generate a task 182. As shown, each task 182 comprises a list of commands 243 that are sent to one of the test devices 153, 159, 163, 166, or 109 (FIG. 1) to facilitate the testing of the integrated circuit 103 (FIG. 1) on the respective evaluation board 109 (FIG. 1). When executed, the commands 243 are executed in the order in which they are depicted in the listing of the graphical user interface 183*b*. It may be the case that the protocol associated with a given test device 153, 159, 163, or 166 requires the communication of data back and forth in addition to the commands 243 themselves in order to successfully communicate the commands 243 to such devices.

The graphical user interface 183*b* advantageously relieves the user of the task of having to write complete programming code that addresses all of the protocol dependent data exchanges as the device testing system 176 (FIG. 1) beyond the commands 243 in order to configure, calibrate, and control the test devices. Specifically, according to one embodiment, the device testing system 176 is advantageously programmed to combine the commands 243 with other necessary data exchanges to facilitate the ongoing data communication between the CPU 113 and the respective one of the devices 153, 159, 163, 166, or 109.

As shown, the user interface 183*b* includes fields within which a user may enter or edit the commands 243. In addition, a second series of response fields 246 are provided to list a response that is generated from a respective testing device in response to the command 243 sent. In addition, the graphical user interface 183*b* includes a delay field 249 for each command 243. The delay field 249 allows a user to insert a desired time delay that is executed after the transmission of each respective command 243 to a respective testing device. Also, log description fields 253 are provided that facilitate the saving of data harvested from the particular testing device during the operation of a given test.

In addition, an address field 256 is included in the graphical user interface 183*b* by which a user may specify given address on a bus for a respective one of the devices 153, 159, 163, or 166 given the respective protocol associated with the graphical user interface 183*b* and the task 182 generated therein. For example, where the graphical user interface 183*b* is employed to generate a task 182 that includes commands that are transmitted using the general purpose interface bus as was described above, then the address field 256 may list a digit that specifically identifies the respective one of the GPIB devices 159 to which the particular task 182 is directed. Similarly, if the given device to which the task 182 is directed is an Ethernet device, then the address field 256 may comprise an IP address on a network to which the device (and the CPU 113) is coupled as can be appreciated. Similarly, the address field 256 may specify a given serial or USB interface coupled to a device, or a given USB device 156 among those that are coupled to the CPU 113.

The graphical user interface 183*b* also includes an instrument name field 259 and a task field 263. The instrument name field 259 is employed to list the name of the particular testing device to which the task 182 is directed. The task name field 263 lists the name of the actual task. Once a given task is generated using the graphical user interface 183*b*, then it may be saved to a non-volatile portion of the memory 126 in the pool of tasks 182.

The graphical user interface 183*b* includes task file manipulation components 266. The task file manipulation components 266 are manipulated by a user to open, save, or generate a new task file for a given task 182 as can be appreciated. In particular, the open button will open one of the tasks 182 stored in the pool of tasks in the non-volatile portion of the memory 126. Also, the save button will save tasks 182 currently displayed in the memory 126. In this respect, a user may open a given task 182 and make changes thereto and save such changed task 182 as a new task with a different name or may simply save the edited task 182 under the same name. This reduces the amount of work potentially that a user may have to perform to create new tasks 182 where the given test devices with which the tasks 182 are associated may be somewhat repetitive from device to device.

When executed, the commands 243 of a task 182 are executed in the order in which they appear in the list from top to bottom in the graphical user interface 183*b*. The commands 243 may be communicated to a respective one of the test devices to control the operation of the test device itself, to configure the test device for operation, to calibrate the test device, to direct the collection and storage of test data, or to perform some other function. In addition, the user interface 183 also includes execution components 269 that may be manipulated to perform a test run of the displayed task 182 and to stop the test run of the task 182. Also, various components are provided in order to load a task 182 into the user interface 183*b*, save the displayed task 182, clear the commands 243 of a currently displayed task 182, abort the running of a task 182, and to run the task 182 in a manner similar as was provided above with the execution components 269. In addition, an exit component 273 is provided that may be manipulated by a user to return to the first graphical user interface 183*a* when a user has completed the creation or editing of a task 182 in the user interface 183*b*.

In addition, the graphical user interface 183*b* provides one example of the various types of graphical user interfaces that may be employed to create and edit tasks 182. Other versions of the graphical user interface 183*b* may be configured to create and edit tasks 182 according to protocols other than GPIB as shown in FIG. 3. Such other versions may employ different fields and graphical components that facilitate the entry of data and commands as they relate to such other protocols.

With reference next to FIGS. 4A, 4B, 4C, and 4D, shown is a flow chart of one example of the operation of the device testing system 176 according to one embodiment of the present invention. Alternatively, the flow chart of FIGS. 4A, 4B, 4C, and 4D may be viewed as depicting steps of an example of a method implemented in the CPU 113 to generate and execute tests of integrated circuits 103 (FIG. 1). The functionality of the device testing system 176 as depicted by the example flow chart of FIGS. 4A, 4B, 4C, and 4D may be implemented, for example, in an object oriented design or in some other programming architecture. Assuming the functionality is implemented in an object oriented design, then each block represents functionality that may be implemented in one or more methods that are encapsulated in one or more objects. The device testing system 176 may be implemented using any one of a number of programming languages such as, for example, C, C++, JAVA, Perl, Python, or other programming languages.

The flow charts depicted in FIGS. 4A-4D illustrates various functions of the device testing system 176. However, it is understood that other functionality may also be incorporated into the device testing system 176 but is not specifically described herein as can be appreciated.

Figure 4A:
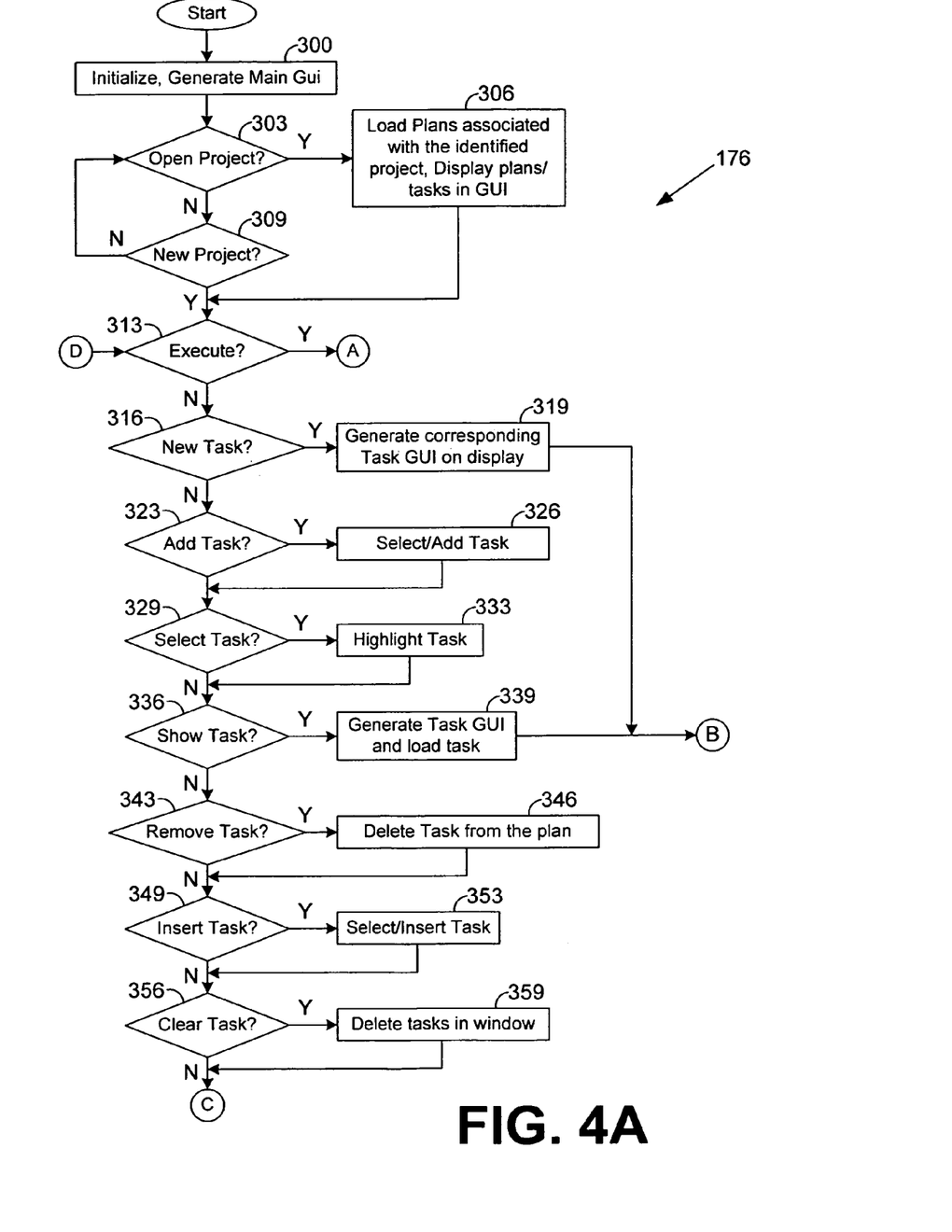
FIGS. 4A, 4B, 4C, and 4D depict a flow chart that illustrates one example of the operation of the device testing system of FIG. 1 according to an embodiment of the present invention.

Beginning with box 300, the device testing system 176 initializes its operation as can be appreciated and generates the graphical user interface 183a on the display device 116 (FIG. 1). Thereafter, in box 303, it is determined whether a project 179 should be opened based upon a user manipulation of an appropriate one of the buttons 239 (FIG. 2). If so, then the device testing system 176 proceeds to box 306. Otherwise, the device testing system 176 moves to box 309.

In box 306, the plans associated with the identified project are loaded into a random access portion of the memory 126 and displayed in the plan window 209. The indication as to which project 179 from which the plans 181 are to be loaded may be determined by presenting one or more graphical user interfaces to a user to select a given one of the projects 179 as can be appreciated. Once a given project 179 is selected the plans 181 associated with such project 179, and the tasks 182 associated with the current highlighted one of the plans 181 are displayed in the plan window 209 and the task window 213, respectively. Thereafter, the device testing system 176 proceeds to box 313.

Assuming that the device testing system 176 has proceeded to box 309, then the device testing system 176 determines whether a new project 179 is to be created based upon the fact that a user has created tasks 182 and a plan 181 associated therewith by manipulating the graphical user interface 183a. Consequently, if in this respect at least a single plan 181 that includes at least one task 182 are shown in the graphical user interface 183a, then the device testing system 176 proceeds to box 313 as shown. Otherwise, the device testing system 176 reverts back to box 303.

In box 313, it is determined whether the device testing system 176 is to execute the tasks 182 of the various plans 181 associated with the current displayed project 179 in the graphical user interface 183a. If so, then the device testing system 176 proceeds to connector A as shown. Otherwise, the device testing system 176 proceeds to box 316. In box 316, the device testing system 176 determines whether a new task 182 is to be created by virtue of the fact a user has manipulated a respective one of the task interface components 233.

If so, then the device testing system 176 proceeds to box 319 in which the corresponding graphical user interface 183b is generated based upon the respective protocol to facilitate a user entry of commands for various ones of the tasks 182 that are created. Thereafter, the device testing system 176 moves to connector B.

If in box 316 a new task is not to be created, then the device testing system 176 proceeds to box 323 in which the device testing system 176 determines whether a task 182 is to be added to the given highlighted plan 181. If so, then the device testing system 176 proceeds to box 326. Otherwise, the device testing system 176 progresses to box 329. Assuming that the device testing system 176 has progressed to box 326, then a separate user interface is generated that allows a user to select a task 182 from the pool of tasks stored in the memory 126 for inclusion as part of the current selected plan 181. The task 182 to be included is inserted at the end of the list of tasks 182 in the task window 213. Thereafter, the device testing system 176 progresses to box 329.

In box 329, the device testing system 176 determines whether a given one of the tasks 182 is selected based upon a user's clicking on such task 182 as described above. Such is the case, then the device testing system 176 proceeds to box 333 in which the respective or selected one of the tasks 182 is highlighted. Thereafter, the device testing system 176 proceeds to box 336. If no selection is made in box 329, then the device testing system 176 also proceeds to box 336.

Assuming the device testing system 176 has reached box 336, then it is determined whether a current highlighted one of the tasks 182 is to be shown to the user. If such is the case, then the device testing system 176 proceeds to box 339. Otherwise, the device testing system 176 moves to box 343. In box 339, the device testing system 176 generates a respective user interface 183b to display the current highlighted task 182. Note that the precise user interface 183b that is generated depends upon the type of task 182 selected which depends upon the protocol employed by such a task 182 and the device to which the task 182 is directed. Thereafter, the device testing system 176 moves to connector B as shown.

Assuming the device testing system 176 reaches block 343, then it is determined whether a task 182 is to be deleted from the current highlighted plan 181. If so, then in box 346 the device testing system 176 deletes the current selected task 182 from the current selected plan 181. Thereafter, the device testing system 176 progresses to box 349. Also, assuming that there is no task 182 to be removed from box 343, then the device testing system 176 also progresses to box 349.

In box 349, the device testing system 176 determines whether a task 182 is to be inserted with respect to a location relative to the current highlighted plan 181. If such is the case, then the device testing system 176 progresses to box 353. Otherwise, the device testing system 176 progresses to box 356. In box 353, the device testing system 176 generates a user interface that may be manipulated to selecting a task 182 from the pool of tasks 182 stored in the memory 126. Thereafter, the selected task 182 is generated in the designated location that may be, for example, a position relative to a current highlighted one of the tasks 182. Thereafter, the device testing system 176 proceeds to box 356.

In box 356, it is determined whether a task is to be completely deleted from a given plan 181. Such would be a task 182 highlighted in the task window 213 in association with a highlighted one of the plans 181. If so, then the device testing system 176 proceeds to box 359. Otherwise, the device testing system 176 progresses to connector C as shown. In box 359, the respective task 182 is deleted from the plan 181. Thereafter, the device testing system 176 progresses to connector C as shown.

Figure 4B:
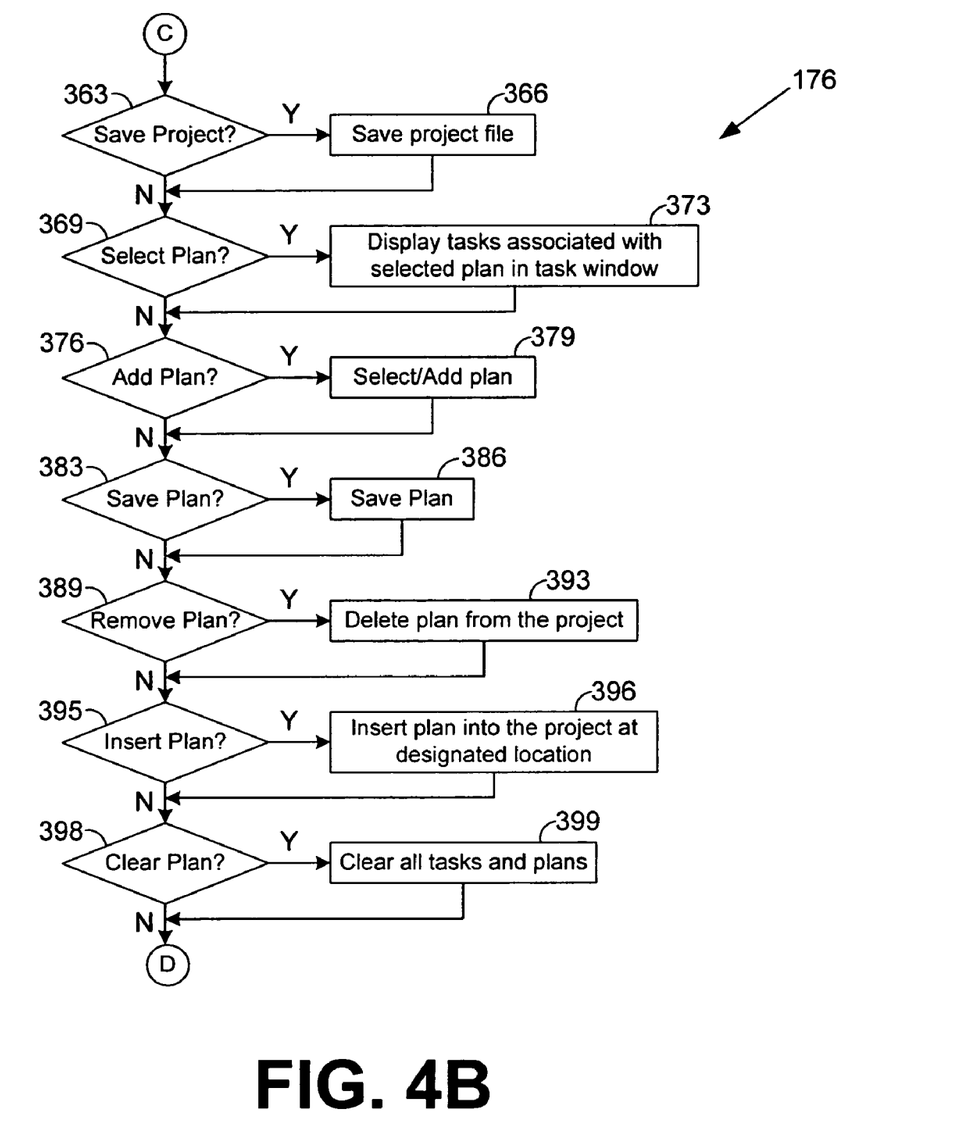

Referring next to FIG. 4B, assuming that the device testing system 176 proceeds to connector C, then in box 363 the device testing system 176 determines whether a project 179 that consists of the existing plans 181 displayed in the plan window 209 and their respective tasks 182 displayed in the task window 213 (when such plans 181 are highlighted) is to be saved as a project 179 in a non-volatile portion of the memory 126. If such is the case, then the device testing system 176 proceeds to box 366. Otherwise, the device testing system 176 progresses to box 369. In box 366, the device testing system 176 saves the project 179 in a non-volatile portion of the memory 126. In this respect, the project file includes a listing of the plans 181 associated therewith including the respective order of the plans 181 as they appear in the plan window 209. Since a number of the tasks 181 in the memory 126 are associated with these plans 182, then the project 179 effectively includes a reference to each of the tasks 182 associated with the respective plans 181.

The actual storage of the tasks 182 is accomplished separately in the task pool of the memory 126 as described above. Also, the association between the tasks 182 and a given one of the plans 181 is accomplished by storing the plans 181 in a separate location of the memory 126 as described above. Once the project file 179 is saved in box 366, then the device testing system 176 proceeds to box 369.

In box 369 it is determined whether a user has selected a given one of the plans 181. In this respect, a user may select a given one of the plans 181 by positioning a cursor over a given one of the plans 181, for example, and "clicking" thereon. Assuming that a user clicks on a given one of the plans 181 or otherwise manipulates an input device 119 to indicate a selection of one of the plans 181, then the highlighting 216 is applied to the plan 181 in the plan window 209 to indicate that such plan 181 is currently selected. Thereafter, in box 373, the tasks 182 associated with the selected plan 181 are displayed in the task window 213. The device testing system 176 then proceeds to box 376. If in box 369 no plan is selected, then the device testing system 176 also proceeds to box 376.

In box 376, it is determined whether a plan is to be added to a given project. Assuming that a plan is to be added in box 376, then the device testing system 176 proceeds to box 379 in which a new plan designation is input using appropriate user interfaces that is then associated with the tasks 182 listed in the task window 213. This new plan designation is listed as one of the plans 181 in the plan window 209. Thereafter, the device testing system 176 proceeds to box 383. Also, assuming that no plan is to be added in box 376, then the device testing system 176 progresses to box 383 directly.

In box 383 the device testing system 176 determines whether a plan 181 is to be saved. In this respect, a user may manipulate the "Save Plan" button 219 (FIG. 2). Assuming such is the case, then the device testing system 176 proceeds to box 386 in which the highlighted one of the plans 181 is saved to a non-volatile portion of the memory 126. Thereafter, the device testing system 176 proceeds to box 389. If no plan is to be saved in box 383, then the device testing system 176 also progresses to box 389. In box 389, it is determined whether a plan 181 is to be removed from the plan window 209. If such is the case, then the device testing system 176 progresses to box 393 in which the current highlighted plan 181 is deleted from the given plan window 209 and from the project 179. Thereafter, the device testing system 176 progresses to box 395.

Also, if no plan is to be removed in box 389, then a device testing system 176 progresses to box 395. In box 395 it is determined whether the device testing system 176 is to insert a plan 181 that was stored in the pool of plans 181 in the memory 126 in a given location relative to a current highlighted one of the plans 181. If so, then the device testing system 176 proceeds to box 396 in which a pre-existing plan 181 is inserted at the designated location. In this process, a user interface may be presented to allow a user to enter the name of the inserted plan 181. The designated location may be determined relative to a current selected one of the plans 181 as indicated by the highlighting 216. Thereafter, the device testing system 176 proceeds to box 398. If the plan 181 is not to be inserted in box 395, then the device testing system 176 moves directly to box 398 as shown.

Next, the device testing system 176 determines whether all of the loaded plans 181 are to be cleared. If such is the case then the device testing system 176 proceeds to box 399 in which all of the plans 181 and tasks 182 associated with a given selected project 179 are cleared from the plan window 209 and task window 213. In doing so, the device testing system 176 may generate a prompt for a user to be sure that they wish to do so before the plans 181 and tasks 182 are eliminated. Thereafter, the device testing system 176 proceeds to connector D. Also, if in box 398 it is determined that the plans 181 are not to be cleared, then the device testing system 176 proceeds directly to connector D as shown. Assuming that the device testing system 176 has progressed to connector D, then ultimately, the device testing system 176 loops back to block 313 as depicted in FIG. 4A as shown. In addition, it is noted that the steps 369, 376, and 383 may not be available if there are no tasks 182 displayed.

Figure 4C:
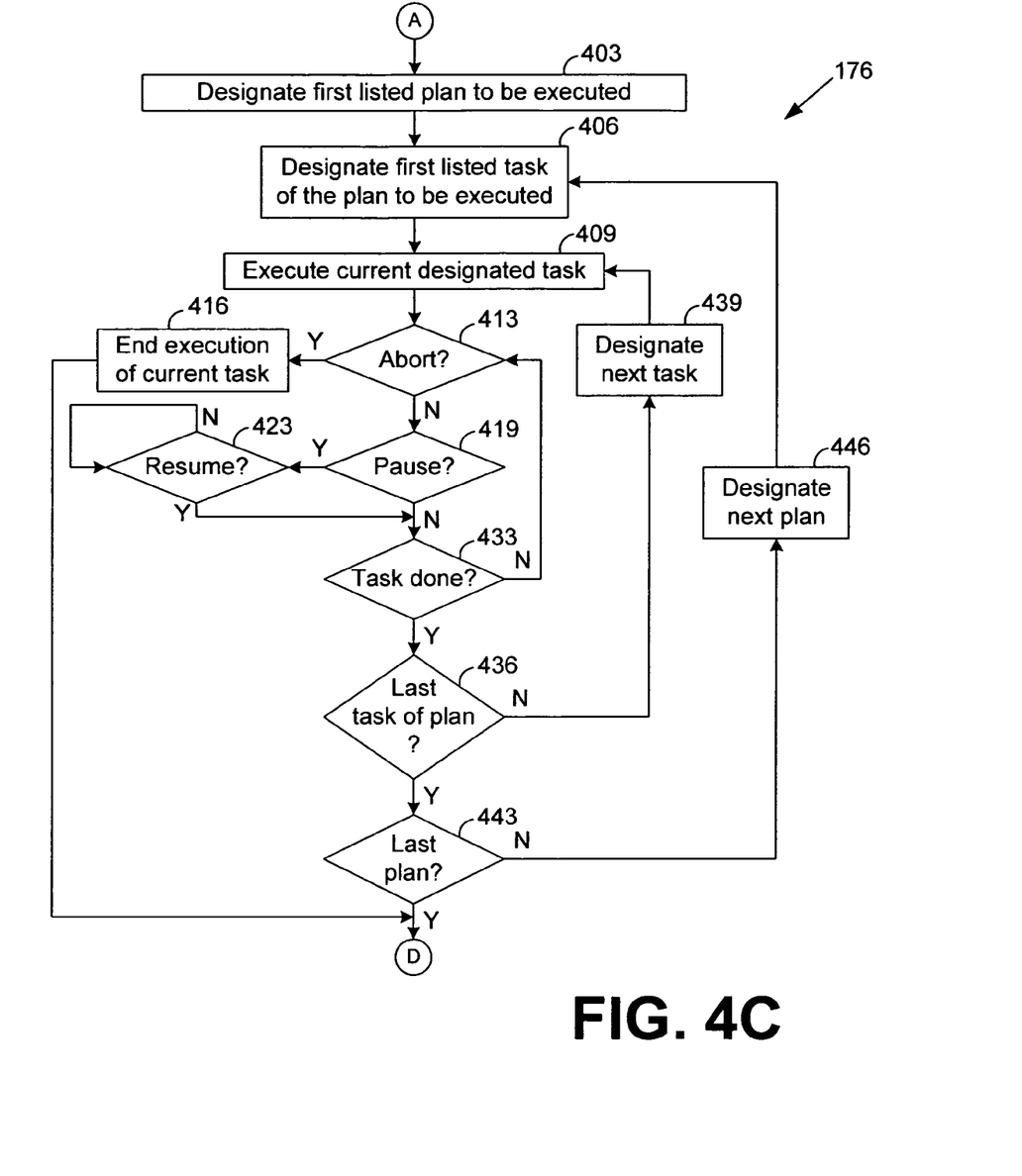

Assuming that the tasks 182 associated with a given project 179 are to be executed due to a manipulation of a run button or other graphical user interface component of the user interface 183a as depicted in box 313, then the device testing system 176 progresses to connector A. Thus, as depicted in FIG. 4C, the device testing system 176 proceeds to run the various tasks 182 associated with the plans 181 of a given project 179. The order of execution of the tasks 181 is inherent in the multi-level hierarchy presented by the plans 181 and the tasks 182 in association with a given project 179. In this respect, the tasks 182 are organized according to the multi-level hierarchy by associating each task 182 with a respective one of the plans 181. Thus, it may be said that a subset of tasks 182 is associated with each of the plans 181. The actual subset of tasks 181 associated with a given one of the plans 181 is thus shown in the task window 213 depending on whether the given plan 181 is selected in the plan window 209 as indicated by the highlighting 216.

The order of execution inherent in the hierarchy relates to the order in which plans 181 and tasks 182 are listed in the plan window 209 and the task window 213, respectively. In this respect, the device testing system 176 executes the tasks 182 of each plan 181 in the order that the plans 181 appear in the list from top to bottom in the plan window 209. Also, the tasks 182 are executed in the order that they appear from top to bottom in the task window 213. The order of execution of the tasks 182 is thus depicted based upon the order of the plans 181 and the tasks 182 in the various windows 209 and 213. However, it can be understood that the order may be determined in some other way based upon the hierarchical relationship.

With this in mind then, the device testing system 176 proceeds from connector A to box 403 in which the first plan listed in the plan window 209 is designated for execution. Thereafter, in box 406, the first listed task 182 associated with the plan designated in box 403 is designated to be executed. Next, in box 409 the current task 182 that has been designated is executed by transmitting each of the commands 243 in the order listed in the task 182 to the respective testing device as described above. Then, in box 413 the device testing system 176 determines whether the execution of the tasks 182 of all the plans 181 in respective order is to be aborted. If so, then the device testing system 176 proceeds to box 416. Otherwise, the device testing system 176 proceeds to box 419.

Assuming that the device testing system 176 has proceeded to box 416, then the execution of the current task 182 is ended and the device testing system 176 leaves the nested loops as depicted in connector D as shown.

If the device testing system 176 has progressed to box 419, then it is determined whether the execution of the tasks 209 of the respective plans 209 in the inherent order is to be paused. If so, then the device testing system 176 progresses to box 423. Otherwise, the device testing system 176 moves to box 433. In box 423 the device testing system 176 waits until an indication is made by the user that the execution is to resume. This indication may be determined when a user clicks on the "continue" one of the execution components 236 of FIG. 2, respectively or the indication may be determined in some other manner. Once the execution of the task 182 is resumed in box 423, then the device testing system 176 proceeds to box 433 as shown.

Assuming that the device testing system 176 has proceeded to box 433, then it is determined whether the current executed task has completed is execution. If such is the case, then the device testing system 176 progresses to box 436. Otherwise, the device testing system 176 reverts back to box 413 as shown.

In box 436, the device testing system 176 determines whether the last task 182 of the current designated plan 181 has been executed. If not, then the device testing system 176 moves to box 439. Otherwise, the device testing system 176 proceeds to box 443. In box 439, the next consecutive one of the tasks 182 of the current designated plan 181 is designated for execution. Thereafter, the device testing system 176 reverts back to box 409.

Assuming that the device testing system 176 has proceeded to box 443, then it is determined whether there are any additional plans 181 of the current project 176 that have tasks 182 that have not been executed. If such plans 181 exist, then the device testing system 176 proceeds to box 446 in which a next consecutive one of the plans 181 listed in the plan window 209 is designated for execution. Thereafter, the device testing system 176 reverts back to box 406 as shown. However, if in box 443 there are no further plans 181 to execute, the device testing system 176 proceeds to connector D as shown. From connector D the device testing system 176 then reverts back to box 313 as depicted in FIG. 4A above as described previously.

Figure 4D:
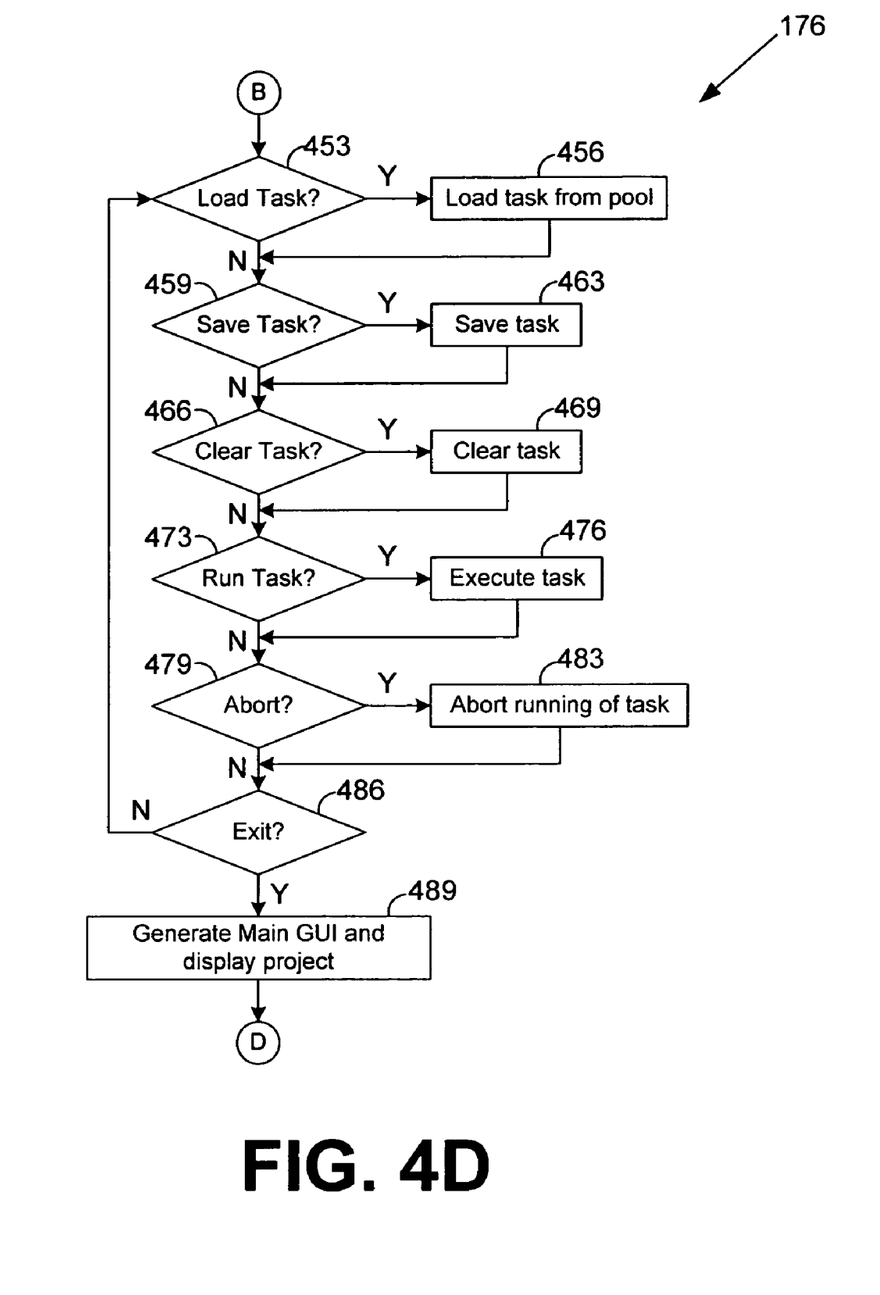

With reference to FIG. 4D, shown is a portion of the device testing system 176 that is executed in conjunction with the display of the graphical user interface 183*b* (FIG. 3) for a respective type of task that is to be created or edited. Upon display of the graphical user interface 183*b*, a user may enter information in the respective fields as described above. In addition, in box 453, the device testing system 176 determines whether a task is to be loaded for editing or execution. This may be determined by a user's manipulation of a load button or other graphical components depicted in the graphical user interface 183*b*. Assuming such is the case, then the device testing system 176 proceeds to box 456. Otherwise, the device testing system 176 progresses to box 459.

In box 456 the respective task 182 to be loaded is identified using appropriate user interfaces and is loaded into a random access portion of the memory 126 and depicted in the graphical user interface 183*b*. Thereafter, the device testing system 176 progresses to box 459. In box 459, the device testing system 176 determines whether the depicted task 182 in the user interface 183*b* is to be saved. If such is the case, then the device testing system 176 progresses to box 463 in which the task 182 is saved in memory 126 as described above. Thereafter, the device testing system 176 progresses to box 466. Also, assuming that no task 182 is to be saved in box 459, the device testing system 176 also proceeds to box 466. In box 466, it is determined whether a task is to be cleared. If so, the device testing system 176 proceeds to box 469 in which all of the commands 243 of a task 182 are cleared from the user interface. Thereafter, the device testing system 176 progresses to box 473. Also, if no task is to be cleared in box 466, the device testing system 176 also proceeds to box 473.

In box 473, it is determined whether a given task 182 depicted in the user interface 183*b* is to be run. If such is the case, then the device testing system proceeds to box 476 in which the task 182 is executed. This may be done in response to a manipulation of the appropriate execution component 269 or by manipulating a run button depicted in the user interface 183*b*. Thereafter, the device testing system 176 progresses to box 479. Also, if no task 182 is run in box 473, then the device testing system 176 also proceeds to box 479.

In box 479, the device testing system 176 determines whether a current running task 182 is to be aborted. If so, then the device testing system 176 progresses to box 483. Otherwise, it proceeds to box 486. This determination may be made by determining whether a user has manipulated an appropriate one of the execution components 269 that stops the execution of the task 182 or whether the user has manipulated an abort button depicted in the user interface 183*b*. Assuming that a running task is to be aborted, then in box 483 the device testing system 176 aborts the running of the given task 182 and, thereafter proceeds to box 486. Also, if no task 182 is to be aborted, then the device testing system 176 proceeds to box 486.

Box 486 it is determined whether the device testing system 176 should exit the current user interface 183*b* as the user has completed their editing or creation of the given task 182. If so, then the device testing system 176 proceeds to box 489 in which the main user interface 183*a* is generated and displayed on the display device 116 (FIG. 1). Thereafter, the device testing system 176 progresses to connector D as shown. On the other hand, if in box 486 the user has not indicated a desired exit as can be determined based upon the user manipulation of the exit button 273, then the device testing system 176 reverts back to box 453 as shown.

Although the device testing system 176 is embodied in software or code executed by general purpose hardware as discussed above, as an alternative the same may also be embodied in dedicated hardware or a combination of software/general purpose hardware and dedicated hardware. If embodied in dedicated hardware, the device testing system 176 can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, programmable gate arrays (PGA), field programmable gate arrays (FPGA), or other components, etc. Such technologies are generally well known by those skilled in the art and, consequently, are not described in detail herein.

The flow charts of FIGS. 4A, 4B, 4C, and 4D show the architecture, functionality, and operation of an implementation of the device testing system 176. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in a computer system or other system. The machine code may be converted from the source code, etc. If embodied in hardware, each block may represent a circuit or a number of interconnected circuits to implement the specified logical function(s).

Although the flow charts of FIGS. 4A, 4B, 4C, and 4D show a specific order of execution, it is understood that the order of execution may differ from that which is depicted. For example, the order of execution of two or more blocks may be scrambled relative to the order shown. Also, two or more blocks shown in succession in FIGS. 4A, 4B, 4C, and 4D may be executed concurrently or with partial concurrence. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present invention.

Also, where the device testing system 176 comprises software or code, it can be embodied in any computer-readable medium for use by or in connection with an instruction execution system such as, for example, a processor in a computer system or other system. In this sense, the logic may comprise, for example, statements including instructions and declarations that can be fetched from the computer-readable medium and executed by the instruction execution system. In the context of the present invention, a "computer-readable medium" can be any medium that can contain, store, or maintain the device testing system 176 for use by or in connection with the instruction execution system. The computer readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, or compact discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A method for facilitating testing of a module, comprising:
   creating a plurality of tasks in a computer system, each of the tasks comprising a list of commands that are sent to a plurality of test devices, the test devices comprising the module to be tested and at least one controlled device interfacing with the module during a test of an operation of the module;
   organizing the tasks according to a multi-level hierarchy; and
   executing the tasks according to an order inherent in the multi-level hierarchy, wherein the execution of each task entails communicating the commands of each task to a respective one of the test devices.

2. The method of claim 1, further comprising the step of employing a communication protocol that is unique to one of the test devices to communicate the commands of the tasks to the one of the test devices.

3. The method of claim 1, wherein the commands of a task communicated to a respective one of the test devices control an operation of the test device.

4. The method of claim 1, wherein the commands of a task communicated to a respective one of the test devices configure the test device for operation.

5. The method of claim 1, wherein the commands of a task communicated to a respective one of the test devices calibrate the test device for operation.

6. The method of claim 1, wherein the commands of a task communicated to a respective one of the test devices provide for a collection of test results from the respective one of the test devices.

7. The method of claim 1, further comprising the step of employing a plurality of communication protocols to communicate the commands of the tasks to the respective ones of the test devices.

8. The method of claim 7, wherein all of the commands of each one of the tasks are communicated to a respective one of the test devices according to one of the protocols.

9. The method of claim 1, further comprising the step of organizing the tasks according to the multi-level hierarchy further comprises the step of associating each task with a respective one of a plurality of plans, thereby associating a subset of the tasks with each of the plans.

10. The method of claim 9, further comprising graphically depicting associations between the tasks and respective ones of the plans in a graphical user interface.

11. The method of claim 9, wherein the order inherent in the multi-level hierarchy is depicted in an order of a list of each of the plans, and in an order of a list of each of the tasks associated with each respective one of the plans.

12. The method of claim 9, further comprising the step of organizing the tasks according to the multi-level hierarchy further comprises the step of associating the plans with a project.

13. The method of claim 12, further comprising the step of storing the project as a file in a non-volatile memory.

14. An apparatus for facilitating testing of a module, comprising:
   a processor circuit having a processor and a memory;
   a plurality of test devices in data communication with the processor circuit, the test devices including the module to be tested and at least one controlled device that interfaces with the module during a test of the operation of the module; and
   a device testing system stored in the memory and executable by the processor, the device testing system comprising;
      logic that facilitates the creation of a plurality of tasks, each of the tasks comprising a list of commands that are sent to a respective one of the test devices;
      logic that organizes the tasks according to a multi-level hierarchy in the memory; and logic that executes the tasks according to an order inherent in the multi-level hierarchy, wherein the execution of each task entails communicating the commands of each task to a respective one of the test devices.

15. The apparatus of claim 14, wherein the module comprises a circuit embodied on an evaluation board that includes an integrated circuit to be tested.

16. The apparatus of claim 14, wherein the communication of the commands of the tasks to respective ones of the test devices is performed using a plurality of communication protocols, wherein each of the test devices communicates according to a respective one of the communication protocols.

17. The apparatus of claim 16, wherein all of the commands of each one of the tasks are communicated to a respective one of the test devices according to one of the protocols.

18. The apparatus of claim 14, wherein the logic that organizes the tasks according to the multi-level hierarchy in the memory further comprises logic that associates each task with a respective one of a plurality of plans, thereby associating a subset of the tasks with each of the plans.

19. The apparatus of claim 18, wherein the order inherent in the multi-level hierarchy is depicted in an order of a list of each of the plans, and in an order of a list of each of the tasks associated with each respective one of the plans.

20. A program embodied on a computer-readable medium and executable by a computer system for facilitating testing of a module, comprising:
  code that facilitates the creation of a plurality of tasks, each of the tasks comprising a list of commands that are sent from the computer system to a respective one of a plurality of test devices, the plurality of test devices including the module to be tested and at least one controlled device that interfaces with the module during the test of the operation of the module;
  code that organizes the tasks according to a multi-level hierarchy in a memory of the computer system; and
  code that executes the tasks according to an order inherent in the multi-level hierarchy, wherein the execution of each task entails communicating the commands of each task to a respective one of the test devices.

21. The program embodied on the computer-readable medium and executable by the computer system of claim 20, wherein the module comprises a circuit embodied on an evaluation board that includes an integrated circuit to be tested.

22. The program embodied on the computer-readable medium and executable by the computer system of claim 20, wherein the communication of the commands of the tasks to respective ones of the test devices is performed using a plurality of communication protocols, wherein each of the test devices communicates according to a respective one of the communication protocols.

23. The program embodied on the computer-readable medium and executable by the computer system of claim 22, wherein all of the commands of each one of the tasks are communicated to a respective one of the test devices according to one of the protocols.

24. The program embodied on the computer-readable medium and executable by the computer system of claim 20, wherein the code that organizes the tasks according to the multi-level hierarchy in the memory of the computer system further comprises code that associates each task with a respective one of a plurality of plans, thereby associating a subset of the tasks with each of the plans.

25. The program embodied on the computer-readable medium and executable by the computer system of claim 24, further comprising code that generates a graphical user interface on a display device, the graphical user interface depicting associations between the tasks and respective ones of the plans.

26. The program embodied on the computer-readable medium and executable by the computer system of claim 24, wherein the order inherent in the multi-level hierarchy is depicted in an order of a list of each of the plans, and in an order of a list of each of the tasks associated with each respective one of the plans.

27. An apparatus for facilitating testing of a module, comprising:
  means for facilitating the creation of a plurality of tasks, each of the tasks comprising a list of commands that are sent from a computer system to a respective one of a plurality of test devices, the plurality of test devices including the module to be tested and at least one controlled device that interfaces with the module during the test of the operation of the module;
  means for organizing the tasks according to a multi-level hierarchy in a memory; and
  means for executing the tasks according to an order inherent in the multi-level hierarchy, wherein the execution of each task entails communicating the commands of each task to a respective one of the test devices.

28. The apparatus of claim 27, wherein the means for organizing the tasks according to the multi-level hierarchy in the memory further comprises means for associating each task with a respective one of a plurality of plans, thereby associating a subset of the tasks with each of the plans.

29. The apparatus of claim 28, further comprising means for generating a graphical user interface on a display device, the graphical user interface depicting associations between the tasks and respective ones of the plans.

* * * * *